United States Patent [19]

Kagawa

[11] 4,331,949
[45] May 25, 1982

[54] THICK FILM PRINTED CIRCUIT

[75] Inventor: Yoshii Kagawa, Soma, Japan

[73] Assignee: Alps Electric Co., Ltd., Tokyo, Japan

[21] Appl. No.: 175,954

[22] Filed: Aug. 7, 1980

[30] Foreign Application Priority Data

Aug. 8, 1979 [JP] Japan .................................. 54-109061

[51] Int. Cl.³ ............................................. H01C 1/012
[52] U.S. Cl. .................................... 338/307; 338/320; 338/325
[58] Field of Search ................................ 338/307–309, 338/260, 314, 48–49, 128, 319, 320, 295, 322, 239, 323, 324, 325, 327, 328, 334; 29/610, 620; 333/81 R

[56] References Cited

U.S. PATENT DOCUMENTS

| | | | |
|---|---|---|---|
| 1,093,968 | 4/1914 | Bicknell | 338/325 |
| 1,919,614 | 7/1933 | Bonanno | 338/48 |
| 2,698,372 | 12/1954 | Pafla | 338/325 |
| 3,710,193 | 1/1973 | Greenberg et al. | 361/388 |
| 4,156,211 | 5/1979 | Buswell et al. | 331/117 D |

FOREIGN PATENT DOCUMENTS 46-26007  7/1971  Japan .................................. 338/320

OTHER PUBLICATIONS

H. C. Briel, et al., Western Electric Technical Digest, "Lattice-Type Film Resistor with High Pulse Voltage Tolerance", No. 33, p. 21, Jan. 1974.

Primary Examiner—C. L. Albritton
Attorney, Agent, or Firm—Guy W. Shoup; Gerard F. Dunne

[57] ABSTRACT

A thick film printed circuit in which a plurality of electrode patterns are disposed with approximately equal spaced intervals between one another, resistance patterns having approximately equal widths are mounted between adjacent electrode patterns of said plurality of electrode patterns, and an identical shaped resistance pattern to said resistance pattern is provided so as to align in parallel with at least one of said resistance patterns, whereby exact divided potential can be obtained.

2 Claims, 4 Drawing Figures

THICK FILM PRINTED CIRCUIT

BACKGROUND OF THE INVENTION

The present invention relates to a thick film printed circuit formed on a ceramic substrate or a printing substrate by printing techniques, and more particularly, relates to a thick film printed circuit for dividing potentials.

Most thick film printed circuits have the advantage that relatively exact resistance values can be obtained because the resistance patterns and/or electrode patterns are formed by a printing operation which ordinarily results in rather high precision.

However, where it is desired to produce a voltage divider on a thick film circuit by dividing a certain voltage from a resistance of a predetermined fixed value formed by printing, the output voltages actually obtained often do not meet those theoretically predicted for the circuit.

SUMMARY OF THE INVENTION

It is the primary object of the present invention to provide a thick film printed circuit including a potential dividing circuit by which any desired divided potentials can be obtained accurately.

It is other object of the present invention to provide a thick film printed circuit including a potential dividing circuit which provides uniformity for the divided potentials.

It is further other object of the present invention to provide an excellent structure of a potential dividing circuit having high performance which can be constructed by almost the same printing processes as those practiced conventionally.

PREFERRED EMBODIMENT OF THE INVENTION

Prior to describing an embodiment of the present invention, a potential dividing circuit of a thick film printed circuit typical of the prior art will be described with reference to FIGS. 1-3.

Figure 1:
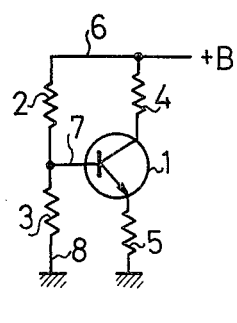
FIG. 1 is a circuit view showing a general bias circuit of a transistor circuit.

In general, in order to apply a bias voltage to a transistor, as shown in FIG. 1, potential divided by the two resistors (2) and (3) is applied to base electrode of the transistor (1), and resistors (4) and (5) are connected, respectively to the collector electrode and the emitter electrode of the transistor. The transistor is supplied with electric power through the resistors (2) and (4), and the other resistors (3) and (5) are grounded respectively.

Figure 2:
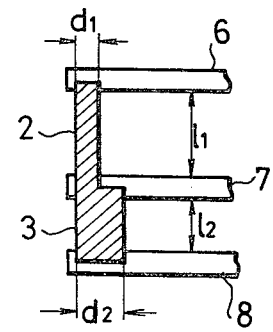
FIG. 2 is a plan view showing resistance patterns of a potential dividing circuit in a conventional thick film printed circuit.
Figure 3:
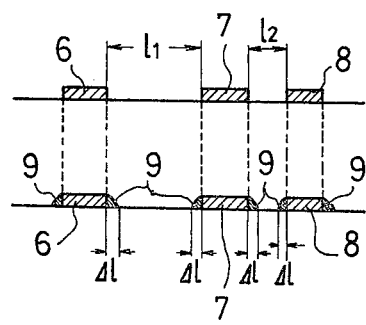
FIG. 3 is a sectional view of printed patterns in a printed circuit.

In the above described circuit, in order to print the resistors (2) and (3), and lead wires (6), (7) and (8) for the resistors (2) and (3) wich are adapted to apply bias voltage to base electrode of transistor (1) on a thick film, as shown in FIG. 2 where the same reference numbers designate the same parts shown in FIG. 1, the electrode patterns (6), (7) and (8) are previously printed on a substrate by using conductive paste to form desired electrode configuration, and in addition the resistance patterns (2) and (3) are formed by printing a paste having a resistive property.

In the above described conventional circuit, the resistance value of the resistance pattern (2) is $R_1$ and it is to be larger than the resistance value $R_2$ of the resistive pattern (3). The resistance patterns are preferably formed from the same material and thus the dimensions of the respective resistance patterns must be varied accordingly. Thus, with the width of the resistance pattern (2) being $d_1$ and its length being set to $l_1$ and the width of resistance pattern (3) being $d_2$ and its length $l_2$, $l_1$ should be greater than $l_2$ and $d_2$ should be greater than $d_1$.

However, in the conventional construction as mentioned the above, it is hard to form the electrode patterns (6), (7) and (8) consistently with the predetermined separation distances of $l_1$ and $l_2$. Further it is likely that the longitudinal edges of the electrode patterns (6), (7) and (8) may have sloping edge portions (9) formed therewith and when conductive paste is printed thereover the lengths of the separation distances between those electrode patterns may vary. The designed resistance values may thus not be obtained.

The sloping edge portion (9) extends outwardly, at the largest, 30μ or so, and this value does not vary very much if the distances $l_1$ or $l_2$ change and is nearly constant regardlss of their length. Consequently, there are some cases in which they significantly vary the ratio of the resistance values of $R_1$ and $R_2$. Also, the widths $d_1$ and $d_2$ of the resistance patterns (2) and (3) may be changed by those edge portions (9) produced at the ends of the resistance patterns (2) and (3) when the resistive paste is printed to make the resistance nonuniform. Further, if the value of $d_1$ differs from that of $d_2$ (i.e., $d_1 \neq d_2$), the divided potentials differ from each other, which is caused by the above described phenomenon.

These relations can be represented as the following expressions, where area-resistance (resistance value of the resistance pattern per unit area) is r, dispersion (nonuniformity) of the electrode pattern is $\Delta l$, and dispersion of the resistance pattern is $\Delta \alpha$, and then resistance values $R_1$ and $R_2$ of the resistance patterns (2) and (3) are represented:

$$R_1 = \frac{l_1 - 2\Delta l}{d^1 + 2\Delta l} r$$

$$R_2 = \frac{l_2 - 2\Delta l}{d_2 + 2\Delta l} r;$$

and divided potential V is represented as follows; here E is voltage of an electric power source.

$$V = \frac{R_2}{R_1 + R_2} \times E$$

$$= \frac{1}{\frac{l_1 - 2\Delta l}{l_2 - 2\Delta l} \times \frac{d_2 + 2\Delta l}{d_1 + 2\Delta l}} \times E$$

Accordingly, due to the phenomenon in which edge portions (9) are produced in the electrode pattern (6), (7), (8) and the resistance pattern (2), dispersion (non-uniformity) is occurred in those divided potentials. Further, the causes of occurring non-uniformity of resistance values vary due to changes of the lengths $l_1$ and $l_2$ of the resistance patterns (2), (3) and the widths $d_1$ and $d_2$ thereof which are varied by side edges (9) produced on the abovementioned patterns.

Figure 4:
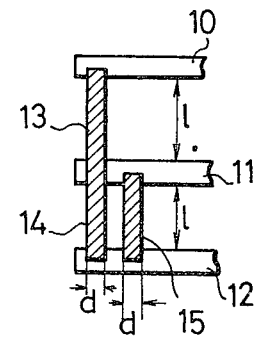
FIG. 4 is a plan view of a potential dividing circuit in a thick film printed circuit according to the present invention.

Next, referring to FIG. 4, we will explain an embodiment of the present invention in detail. In FIG. 4 a circuit pattern construction to divide the electric source voltage by one-third is shown. It is configurated as follows; that is, electrode patterns (10), (11) and (12) are formed with conductive paste at equi-distance with each other on a substrate, then equi-width resistance patterns (13), (14) and (15) are formed with a paste having resistive property on the substrate. Further, for obtaining one-third potential of the voltage, between the electrode pattern (11) and (12) two resistance patterns (14) and (15) are disposed.

Since the electrode patterns are located on the substrate with equi-distance, the resistance patterns (13), (14) and (15) are equal in length, and the widths are also adapted to be equal with one another, so that all resistance values on the potential dividing circuit are made to be equal. Consequently, at the electrode pattern (11) an exact potential divided to one-third of the voltage of the electric power source can be obtained.

Considering the electrode patterns (10), (11), (12), and the resistance patterns (13), (14) and the side edges (15), the resistance value of R of the resistance pattern is represented by the following expression:

$$R = \frac{l - 2\Delta l}{d + 2\Delta l}$$

where, separation distance between the electrode patterns is l, length of side edge is $\Delta l$, width of the resistance pattern is d and size of the side edge is $\Delta d$. As can be clearly understood from the above expression, the resistance value is effected by the side edge, however, since the shape of the resistance patterns (10), (11) and (12) are the same, the resistance value of each of them is equal to R. Now, for example, we will hereinafter consider a divided potential V, according to the following expression;

$$V = \frac{1}{R + R/2} \times E = \tfrac{1}{3} E$$

As can be clearly seen from the above result, according to the present invention, a constant divided potential value can be obtained. Further, in the case of dividing the electric source to two-fifths, two resistance patterns are provided between the electrode patterns (10) and (11) independently, and between the electrode patterns (11) and (12), three resistance patterns are provided independently with one another, and further it is preferable to make those resistance patterns an identical shape.

What is claimed is:

1. A thick film printed circuit including a potential dividing circuit having a plurality of printed resistance patterns for dividing voltage; said potential dividing circuit including:

first, second and third electrode patterns; a first resistance pattern having a uniform width extending transversely across the first, second and third electrode patterns; and a second resistance pattern adjacent and in parallel to said first resistance pattern, said second resistance pattern having a width substantially equal to that of the first resistance pattern and extending between said second electrode pattern and only one of said first and third electrode patterns.

2. A thick film printed circuit according to claim 1, wherein a plurality of said second resistance patterns are provided.

* * * * *